(12) United States Patent
Hirakimoto et al.

(10) Patent No.: US 6,711,726 B2
(45) Date of Patent: Mar. 23, 2004

(54) AUTOMATIC CELL PLACEMENT AND ROUTING APPARATUS AND AUTOMATIC CELL PLACEMENT AND ROUTING METHOD USED FOR THE APPARATUS

(75) Inventors: Koji Hirakimoto, Tokyo (JP); Ken Saito, Tokyo (JP); Tatsuya Umeda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 120 days.

(21) Appl. No.: 09/827,932

(22) Filed: Apr. 9, 2001

(65) Prior Publication Data

US 2002/0046389 A1 Apr. 18, 2002

(30) Foreign Application Priority Data

Oct. 18, 2000 (JP) ........................ 2000-318092

(51) Int. Cl.[7] ............................................. G06F 17/50
(52) U.S. Cl. ............................ 716/10; 716/5; 716/9; 716/12; 716/17
(58) Field of Search ........................... 716/5, 9, 10, 12, 716/17

(56) References Cited

U.S. PATENT DOCUMENTS

| | | | | |
|---|---|---|---|---|
| 4,890,238 A | * | 12/1989 | Klein et al. ...................... | 716/7 |
| 5,225,991 A | * | 7/1993 | Dougherty ...................... | 716/9 |
| 5,583,788 A | * | 12/1996 | Kuribayashi ................... | 716/14 |
| 5,671,397 A | * | 9/1997 | Crafts ............................. | 716/17 |
| 5,774,371 A | * | 6/1998 | Kawakami ..................... | 716/10 |
| 6,269,466 B1 | * | 7/2001 | Crafts ............................. | 716/1 |
| 6,401,234 B1 | * | 6/2002 | Alpert et al. ................... | 716/13 |
| 6,405,350 B1 | * | 6/2002 | Tawada .......................... | 716/5 |
| 6,457,166 B1 | * | 9/2002 | Shoyama ........................ | 716/18 |
| 6,477,687 B1 | * | 11/2002 | Thomas .......................... | 716/8 |
| 6,505,329 B1 | * | 1/2003 | Matsuzawa ..................... | 716/8 |
| 6,510,549 B1 | * | 1/2003 | Okamura ........................ | 716/17 |
| 6,532,579 B2 | * | 3/2003 | Sato et al. ....................... | 716/8 |
| 6,543,040 B1 | * | 4/2003 | Bednar et al. .................. | 716/7 |
| 6,629,300 B1 | * | 9/2003 | Otake .............................. | 716/8 |

FOREIGN PATENT DOCUMENTS

| | | | | |
|---|---|---|---|---|
| JP | 5-235168 | | 9/1993 | ........... H01L/21/82 |
| JP | 407014927 A | * | 1/1995 | ........... H01L/21/82 |
| JP | 02000114468 A | * | 10/1998 | ........... H01L/27/04 |
| JP | 10-308451 | | 11/1998 | ........... H01L/21/82 |
| JP | 11-40677 | | 2/1999 | ........... H01L/21/82 |

OTHER PUBLICATIONS

NN9707167 ("Minimum Size Complementary Metal Oxide Semiconductor Buffer Circuit", IBM Technical Disclosure Bulletin, vol. 40, No. 7, Jul. 1997, pp. 167–168 (2 pages)).*
NA9003176 ("Dense Multi–Port SRAM Cell", IBM Technical Disclosure Bulletin, vol. 32, No. 10A, Mar. 1990, pp. 176–178 (5 pages)).*

* cited by examiner

*Primary Examiner*—Matthew Smith
*Assistant Examiner*—Phallaka Kik
(74) *Attorney, Agent, or Firm*—Burns, Doane, Swecker & Mathis, L.L.P.

(57) ABSTRACT

A buffer cell and an inverter cell are embedded in advance in an internal open space of each of mega-cells and IO cells composing a semiconductor integrated circuit. Thereafter, in cases where it is expected that a cross-talk noise is generated in a signal transmitting through a particular wire of the semiconductor integrated circuit, one mega-cell or one IO cell, which is placed in a position nearest to a generation position of the cross-talk noise, is selected from the mega-cells and the IO cells, and the buffer cell or the inverter cell embedded in the selected mega-cell or the selected IO cell is inserted into the particular wire. Therefore, because the capacitance between the particular wire and each wire adjacent to the particular wire is reduced, the cross-talk noise can be reduced.

13 Claims, 13 Drawing Sheets

FIG.1
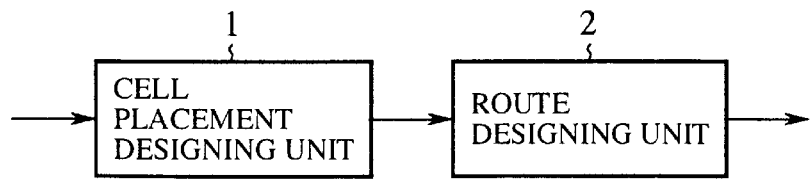
FIG.2A    FIG.2B
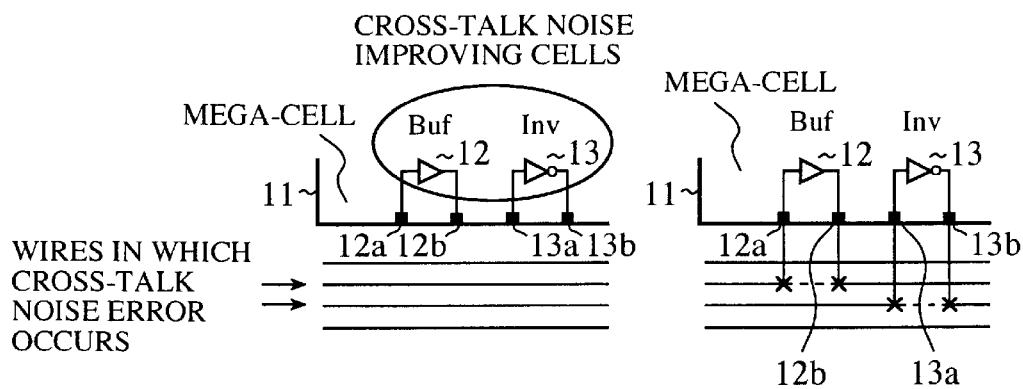
FIG.3A    FIG.3B
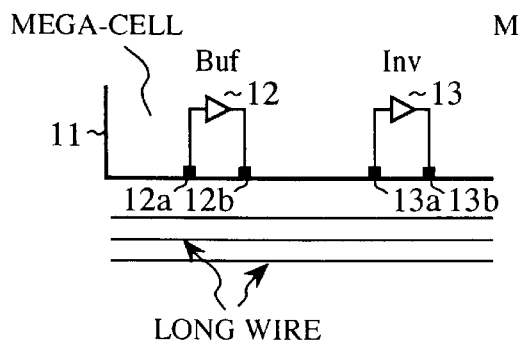
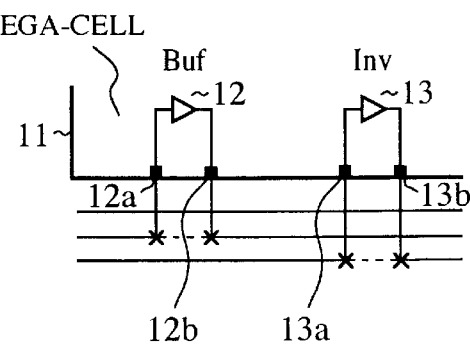

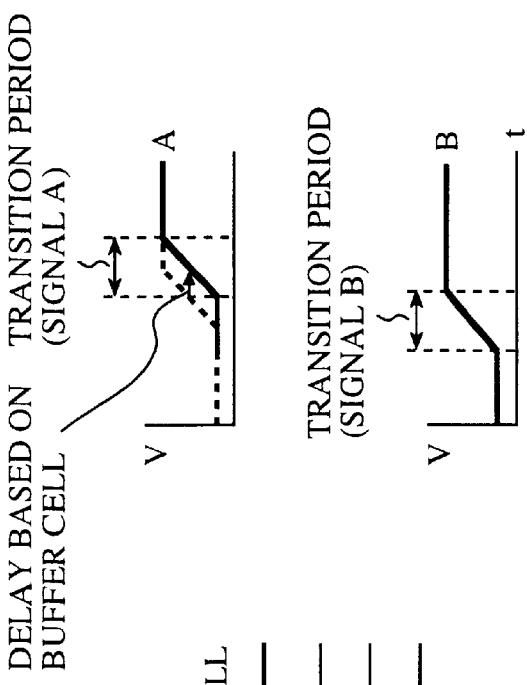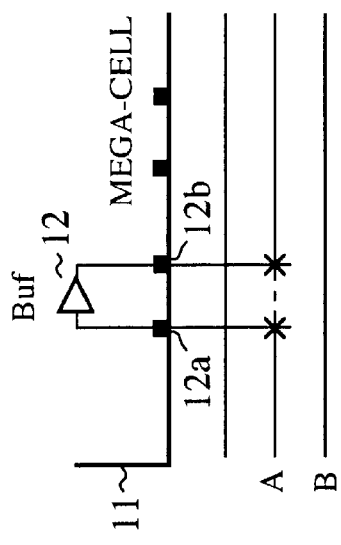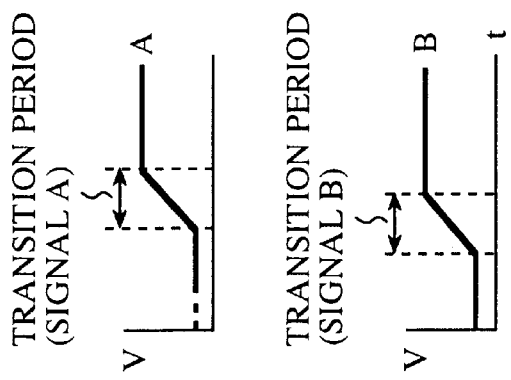

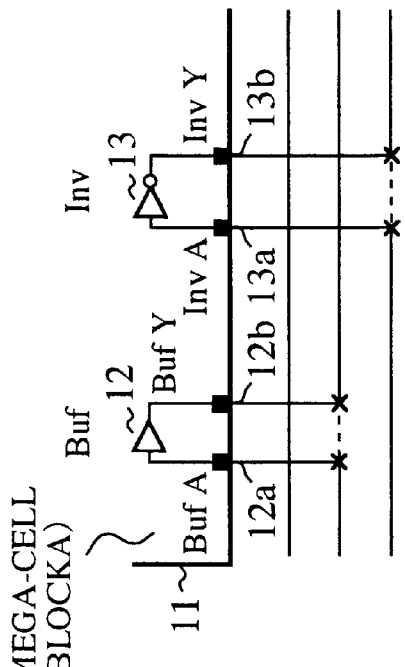
FIG.9A  FIG.9C
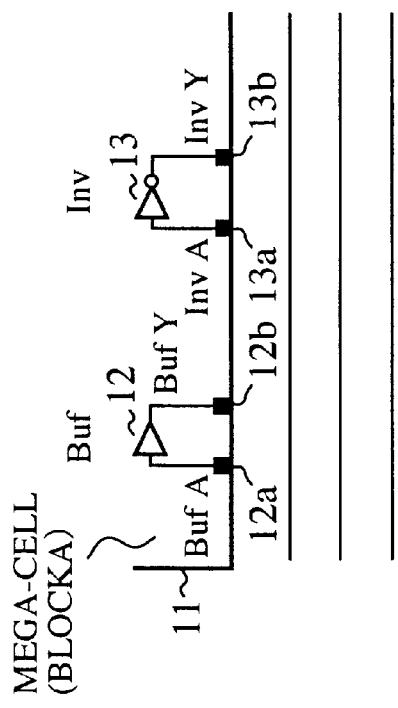
FIG.9B
.SUBCKT BLOCKA
+ OUT(0) OUT(1) OUT(2) OUT(3)
+ ............
+ IN(0) IN(1) IN(2) IN(3)
+ ............
+
FIG.9D
.SUBCKT BLOCKA
+ Buf Y Inv Y
+ OUT(0) OUT(1) OUT(2) OUT(3)
+ ............
+ Buf A Inv A
+ IN(0) IN(1) IN(2) IN(3)
+ ............
+

FIG.10A
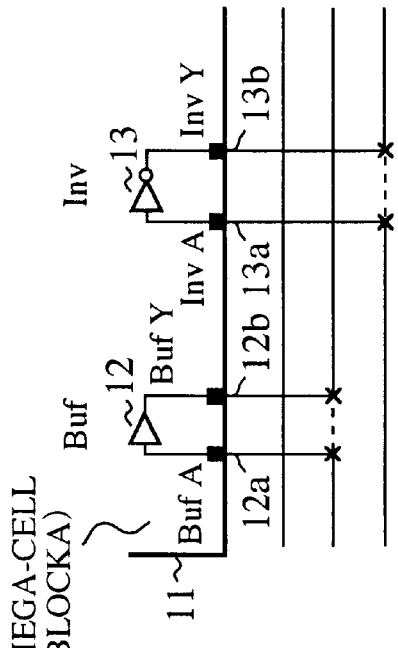
FIG.10B
.SUBCKT BLOCKA
+ OUT(0) OUT(1) OUT(2) OUT(3)
+ .........
+ IN(0) IN(1) IN(2) IN(3)
+ .........
+
FIG.10C
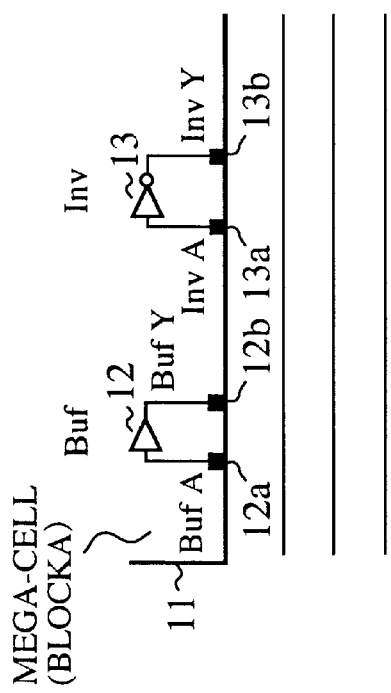
FIG.10D
.SUBCKT BLOCKA
+ OUT(0) OUT(1) OUT(2) OUT(3)
+ .........
+ IN(0) IN(1) IN(2) IN(3)
+ .........
+ .SUBCKT Buf Buf Y Buf A
.SUBCKT Inv Inv Y Inv A

\<CASE 4\> THREE-DIMENSIONAL SHIELD (4)

\<CASE 5\> THREE-DIMENSIONAL SHIELD (5)

<CASE 6> THREE-DIMENSIONAL SHIELD (6)

<CASE 7> THREE-DIMENSIONAL SHIELD (7)

AUTOMATIC CELL PLACEMENT AND ROUTING APPARATUS AND AUTOMATIC CELL PLACEMENT AND ROUTING METHOD USED FOR THE APPARATUS

BACKGROUND OF THE INVENTION

1. Field of the Invention

The present invention relates to an automatic cell placement and routing apparatus in which a layout of cells composing a semiconductor integrated circuit is designed not to receive an adverse influence of a cross-talk noise generated when the semiconductor integrated circuit is actually operated. Also, the present invention relates to an automatic cell placement and routing method used for the apparatus.

2. Description of Related Art

When a layout of cells composing a semiconductor integrated circuit is designed, to reduce cross-talk noise generated in the semiconductor integrated circuit, a method for widening an interval between wires adjacent to each other and/or inserting a buffer cell or an inverter cell into a wire is adopted in a conventional automatic cell placement and routing apparatus. Therefore, a capacitance between wires adjacent to each other is reduced, and the cross-talk noise is reduced.

This automatic cell placement and routing apparatus is, for example, disclosed in the Published Unexamined Japanese Patent Application No. H11-40677 (1999).

However, it is impossible to reduce a capacitance between wires adjacent to each other in a crowded cell area such as a peripheral area of a hard macro-block (for example, a mega-cell such as a read only memory (ROM) cell or a random access memory (RAM) cell and an input-output (IO) cell) in which the insertion of a buffer cell is difficult, a cell insertion inhibit area and a crowded wire area in which the widening of an interval between wires adjacent to each other is difficult. Therefore, because the above-described method is adopted in the conventional automatic cell placement and routing apparatus, there is a problem that it is impossible to reduce the cross-talk noise in the crowded cell area, the cell insertion inhibit area and the crowded wire area.

SUMMARY OF THE INVENTION

An object of the present invention is to provide, with due consideration to the drawbacks of the conventional automatic cell placement and routing apparatus, an automatic cell placement and routing apparatus in which cross-talk noise is reduced without increasing an area of a semiconductor integrated circuit. Also, the object of the present invention is to provide an automatic cell placement and routing method used for the apparatus.

The object is achieved by the provision of an automatic cell placement and routing apparatus in which the placement of hard macro-blocks composing a semiconductor integrated circuit is designed and the routing in the semiconductor integrated circuit is designed. An automatic cell placement and routing apparatus comprises a designing unit for embedding a cross-talk noise improving cell, which has an external interface, in an internal open space of one hard macro-block and inserting the cross-talk noise improving cell into a wire of the semiconductor integrated circuit.

In the above configuration, because the cross-talk noise improving cell embedded in the hard macro-block is inserted into a wire of the semiconductor integrated circuit, the capacitance between the wire and an adjacent wire is reduced.

Accordingly, the cross-talk noise can be reduced without increasing an area of the semiconductor integrated circuit.

It is preferred that the cross-talk noise improving cell is inserted into one of wires adjacent to each other by the designing unit in cases where level transition periods of signals of the wires overlap with each other.

Accordingly, the adverse influence of the cross-talk noise can be reduced.

It is preferred that an inverter cell denoting the cross-talk noise improving cell is inserted into one of wires adjacent to each other by the designing unit in cases where level transition periods of signals of the wires overlap with each other and level transition directions of the signals differ from each other.

Accordingly, the adverse influence of the cross-talk noise can be reduced.

It is preferred that the cross-talk noise improving cell is inserted into a first wire by the designing unit in cases where a level transition period of a signal of the first wire overlaps with a level transition period of a signal of a second wire adjacent to the first wire and the level transition period corresponding to the first wire is longer than that corresponding to the second wire.

Accordingly, the adverse influence of the cross-talk noise can be reduced.

It is preferred that a plurality of types of cross-talk noise improving cells are embedded in the internal open space of the hard macro-block by the designing unit, and one type of cross-talk noise improving cell selected from the types of cross-talk noise improving cells is inserted into the wire of the semiconductor integrated circuit by the designing unit.

Accordingly, the adverse influence of the cross-talk noise can be reduced with high precision.

It is preferred that a plurality cross-talk noise improving cells are embedded in the internal open space of the hard macro-block by the designing unit, and one or more cross-talk noise improving cells selected from the cross-talk noise improving cells are inserted into the wire of the semiconductor integrated circuit by the designing unit.

Accordingly, the adverse influence of the cross-talk noise can be reduced with high precision.

It is preferred that the cross-talk noise improving cell is embedded in an open space, which is placed in the outside of the hard macro-block, by the designing unit to insert the cross-talk noise improving cell into the wire of the semiconductor integrated circuit.

Accordingly, the cross-talk noise can be reduced without increasing an area of the semiconductor integrated circuit.

It is preferred that connection information of the cross-talk noise improving cell is output as a netlist by the designing unit.

Accordingly, an operator can ascertain the connection of the cross-talk noise improving cell with the wire.

It is preferred that connection information of the cross-talk noise improving cell is output by the designing unit as a netlist in which the cross-talk noise improving cell embedded in the internal open space of the hard macro-block seems to be arranged independent of the hard macro-block.

Accordingly, an operator can easily ascertain the connection of the cross-talk noise improving cell with the wire.

The object is also achieved by the provision of an automatic cell placement and routing apparatus in which the placement of hard macro-blocks composing a semiconductor integrated circuit is designed and the routing in the semiconductor integrated circuit is designed. An automatic cell placement and routing apparatus comprises a designing unit for placing a signal driving cell at a position near to a cross-coupling occurring position and inserting the signal driving cell into a wire of the semiconductor integrated circuit.

In the above configuration, because the signal driving cell is moved to the position near to the cross-coupling occurring position, a wire length between the signal driving cell and the cross-coupling occurring position is shortened. Therefore, the capacitance between the wire and another adjacent wire corresponding to the occurrence of noise is reduced.

Accordingly, the cross-talk noise can be reduced without increasing an area of the semiconductor integrated circuit.

The object is also achieved by the provision of an automatic cell placement and routing apparatus in which the placement of hard macro-blocks composing a semiconductor integrated circuit is designed and the routing in the semiconductor integrated circuit is designed. An automatic cell placement and routing apparatus comprises a designing unit for moving one of wires, which are adjacent to each other and are arranged in a wiring plane, to another wiring plane and arranging a shielding wire in an opening area in which the moved wire is originally arranged.

In the above configuration, the shielding wire is arranged in place of the moved wire.

Accordingly, the cross-talk noise can be reduced without increasing an area of the semiconductor integrated circuit.

It is preferred that an electric power supply wire is arranged as the shielding wire by the designing unit.

Accordingly, the cross-talk noise can be reduced.

It is preferred that a ground wire is arranged as the shielding wire by the designing unit.

Accordingly, the cross-talk noise can be reduced.

It is preferred that an automatic cell placement and routing method using the automatic cell placement and routing apparatus includes the step of inserting the cross-talk noise improving cell into the wire.

Accordingly, the cross-talk noise can be reduced without increasing an area of the semiconductor integrated circuit.

It is preferred that an automatic cell placement and routing method using the automatic cell placement and routing apparatus includes the step of placing the signal driving cell, which is to be inserted into the wire, at the position near to the cross-coupling occurring position.

Accordingly, the cross-talk noise can be reduced without increasing an area of the semiconductor integrated circuit.

It is preferred that an automatic cell placement and routing method using the automatic cell placement and routing apparatus includes the steps of moving one of the wires, which are adjacent to each other and are arranged in a wiring plane, to another wiring plane, and arranging the shielding wire in the opening area in which the moved wire is originally arranged.

Accordingly, the cross-talk noise can be reduced without increasing an area of the semiconductor integrated circuit.

BRIEF DESCRIPTION OF THE DRAWINGS

FIG. 1 is a block diagram showing the configuration of an automatic cell placement and routing apparatus according to first to twelfth embodiments of the present invention;

FIG. 2A is a plan view showing a buffer cell and an inverter cell, which are embedded in the internal of a mega-cell arranged in a part of a semiconductor integrated circuit, according to the first embodiment of the present invention;

FIG. 2B shows the buffer cell and the inverter cell which are inserted in wires in which error occurs because of cross-talk noise;

FIG. 3A is a plan view showing a buffer cell and an inverter cell, which are embedded in the internal of a mega-cell arranged in a part of a semiconductor integrated circuit, according to a second embodiment of the present invention;

FIG. 3B shows the buffer cell and the inverter cell which are inserted in long wires which are placed in the neighborhood of the mega-cell;

FIG. 4A shows level transition periods of signals overlapping with each other according to a third embodiment of the present invention;

FIG. 4B is a plan view showing a buffer cell which is embedded in the internal of a mega-cell arranged in a part of a semiconductor integrated circuit and is inserted into a wire corresponding to one signal to delay a level change of the signal;

FIG. 4C shows the signals of which the level transition periods do not overlap with each other;

FIG. 9A is a plan view showing a buffer cell and an inverter cell, which are embedded in the internal of a mega-cell arranged in a part of a semiconductor integrated circuit, according to a ninth embodiment of the present invention;

FIG. 9B shows a netlist indicating connection information of the semiconductor integrated circuit shown in FIG. 9A;

FIG. 9C is a plan view showing a buffer cell and an inverter cell, which are embedded in the internal of a mega-cell arranged in a part of a semiconductor integrated circuit and are inserted into wires-respectively, according to the ninth embodiment of the present invention;

FIG. 9D shows a netlist indicating connection information of the semiconductor integrated circuit and connection information of cross-talk noise improving cells shown in FIG. 9C;

FIG. 10A is a plan view showing a buffer cell and an inverter cell, which are embedded in the internal of a mega-cell arranged in a part of a semiconductor integrated circuit, according to a tenth embodiment of the present invention;

FIG. 10B shows a netlist indicating connection information of the semiconductor integrated circuit shown in FIG. 10A;

FIG. 10C is a plan view showing a buffer cell and an inverter cell, which are embedded in the internal of a mega-cell arranged in a part of a semiconductor integrated circuit and are inserted into wires respectively, according to the tenth embodiment of the present invention;

FIG. 10D shows a netlist indicating connection information of the semiconductor integrated circuit and connection information of cross-talk noise improving cells shown in FIG. 10C;

DETAILED DESCRIPTION OF THE PREFERRED EMBODIMENTS

Figure 5A:
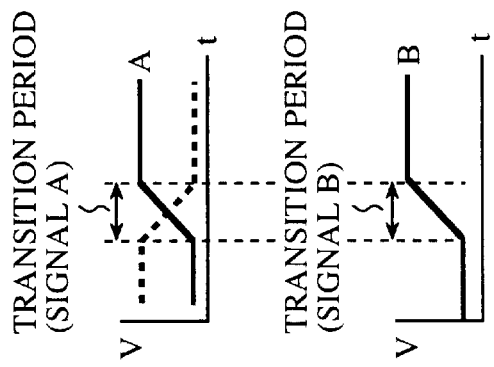
FIG. 5A shows signals, in which level transition directions differ from each other while level transition periods overlap with each other, according to a fourth embodiment of the present invention.
Figure 5B:
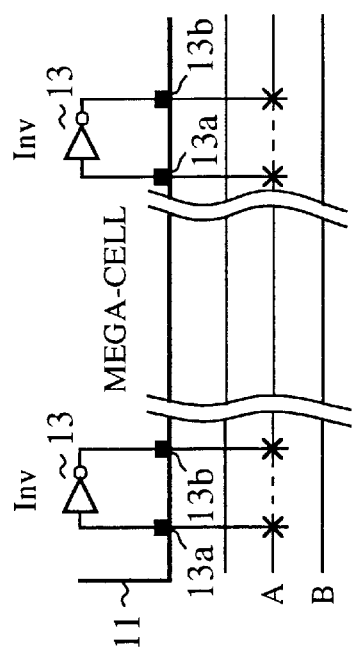
FIG. 5B is a plan view showing a buffer cell and an inverter cell which are embedded in the internal of a mega-cell arranged in a part of a semiconductor integrated circuit and are inserted into a wire corresponding to one signal to make the level transition directions of the signal agree with each other.

Embodiments of the present invention will now be described with reference to the accompanying drawings.
Embodiment 1

FIG. 1 is a block diagram showing the configuration of an automatic cell placement and routing apparatus according to first to twelfth embodiments of the present invention. In FIG. 1, 1 indicates a cell placement designing unit (or a designing unit) for designing the placement of hard macroblocks (for example, a mega-cell and an input-output (IO) cell) composing a semiconductor integrated circuit according to various types of design conditions. 2 indicates a route designing unit (or a designing unit) for designing a route of each signal wire (hereinafter, called "wire") of the semiconductor integrated circuit according to the various types of design conditions.

FIG. 2A is a plan view showing a buffer cell and an inverter cell which are embedded in the internal of a mega-cell arranged in a part of a semiconductor integrated circuit. In FIG. 2A, 11 indicates a mega-cell arranged in a part of the semiconductor integrated circuit. 12 indicates a buffer cell (indicated by "Buf" in FIG. 2) embedded in an internal open space of the mega-cell 11. The buffer cell 12 denotes a cross-talk noise improving cell for reducing a capacitance between wires adjacent to each other. 12a and 12b indicate terminals (or external interfaces) of the buffer cell 12. The terminals 12a and 12b are arranged in the inside of the mega-cell 11 or are arranged so as to be attached to a frame of the mega-cell 11. 13 indicates an inverter cell (indicated by "Inv" in FIG. 2) embedded in the internal open space of the mega-cell 11. The inverter cell 13 denotes a cross-talk noise improving cell for reducing a capacitance between wires adjacent to each other. 13a and 13b indicate terminals (or external interfaces) of the inverter cell 13. The terminals 13a and 13b are arranged in the inside of the mega-cell 11 or are arranged so as to be attached to the frame of the mega-cell 11.

Next, an operation is described.

In general, when a mega-cell or an IO cell is developed, a pin is arranged to receive and transmit a signal from/to the outside. Also, because it is required to prevent the deterioration of a design efficiency in a chip level design, the mega-cell or the IO cell is generally formed in a rectangular shape or in an L letter shape. Therefore, a redundant area (or an open space) is necessarily produced in the mega-cell 11 or the IO cell. In this case, though a position of the redundant area in the mega-cell 11 or the IO cell cannot be specified, the whole area of the mega-cell 11 or the IO cell is not occupied by devices and wires. Therefore, a redundant area is necessarily produced in the mega-cell 11 or the IO cell.

Therefore, in the first embodiment, when a layout of cells composing a semiconductor integrated circuit is designed by the cell placement designing unit 1 of the automatic cell placement and routing apparatus, as shown in FIG. 2A, the buffer cell 12 and/or the inverter cell 13 denoting the cross-talk improving cells are embedded in advance in an internal open space of each of mega-cells 11 and IO cells.

Thereafter, in the route designing unit 2 of the automatic cell placement and routing apparatus, when it is expected that a cross-talk noise is generated in a signal (or signals) transmitting through a wire (or wires) of the semiconductor integrated circuit, as shown in FIG. 2A, a mega-cell 11 (or an IO cell), which is placed in a position nearest to a generation position of the cross-talk noise, is selected from the mega-cells 11 and the IO cells. Thereafter, as shown in FIG. 2B, the buffer cell 12 and/or the inverter cell 13 embedded in the internal of the selected mega-cell 11 (or the selected IO cell) are inserted into specific wires, in which signal error occurs because of the influence of the cross-talk noise, to reduce a value of capacitance between the specific wires adjacent to each other. Therefore, the cross-talk noise generated in the semiconductor integrated circuit can be reduced.

As is described above, in the first embodiment, the cross-talk improving cell having the external interfaces (or the terminals) is embedded in the internal open space of the hard macro-block, and the cross-talk improving cell is inserted into a wire of the semiconductor integrated circuit. Accordingly, the cross-talk noise can be reduced without increasing an area of the semiconductor integrated circuit.

Embodiment 2

In the first embodiment, the buffer cell 12 and the inverter cell 13 embedded in the internal open space of the mega-cell 11 or the IO cell are inserted into wires in which signal error occurs because of the influence of the cross-talk noise. However, in general, a wire having a long wire length is liable to be influenced by the cross-talk noise. Therefore, in a second embodiment, as shown in FIG. 3A, one or more wires, which extend through the neighborhood of the mega-cell 11 or the IO cell, are selected from wires which respectively have a wire length equal to or longer than a prescribed value. Thereafter, as shown in FIG. 3B, the buffer cell 12 and the inverter cell 13 embedded in the internal open space of the mega-cell 11 or the IO cell are inserted into the selected wires to shorten the length of each selected wire.

Accordingly, the adverse influence of the cross-talk noise generated in the semiconductor integrated circuit can be reduced.

Embodiment 3

In the first embodiment, the buffer cell 12 and the inverter cell 13 embedded in the internal open space of the mega-cell 11 or the IO cell are inserted into wires in which signal error occurs because of the influence of the cross-talk noise. However, in a third embodiment, when a level transition period of a signal transmitting through a wire overlaps with that of a signal transmitting through another wire on condition that the wires are adjacent to each other, the cross-talk noise improving cell is inserted into one of the wires to make the level transition periods of the signals not overlap with each other.

In detail, in the route designing unit 2, level transition periods of signals A and B, which transmit through wires adjacent to each other, are calculated according to a dynamic or static timing analysis. In general, when level transition periods of signals transmitting through wires adjacent to each other overlap with each other, the signals are liable to be influenced by a cross-talk noise generated between the wires. Therefore, as shown in FIG. 4A, when the level transition periods of the signals A and B overlap with each other, as shown in FIG. 4B, the buffer cell 12 is inserted as a delay device into the wire corresponding to the signal A. Therefore, as shown in FIG. 4C, the level change of the signal A is delayed by the buffer cell 12, and the level transition periods of the signals A and B do not overlap with each other.

Accordingly, the adverse influence of the cross-talk noise generated in the semiconductor integrated circuit can be reduced.

Embodiment 4

In the first embodiment, the buffer cell 12 and the inverter cell 13 embedded in the internal open space of the mega-cell 11 or the IO cell are inserted into wires in which signal error occurs because of the influence of the cross-talk noise. However, in a fourth embodiment, when level transition periods of signals transmitting through wires adjacent to each other overlap with each other, it is checked whether or not level transition directions of the signals differ from each other. When the level transition directions of the signals differ from each other, a pair of inverter cells 13 embedded in an internal open space of the mega-cell 11 or the IO cell are inserted into both ends of one of the wires respectively to make the level transition directions of the signals agree with each other.

Figure 5C:
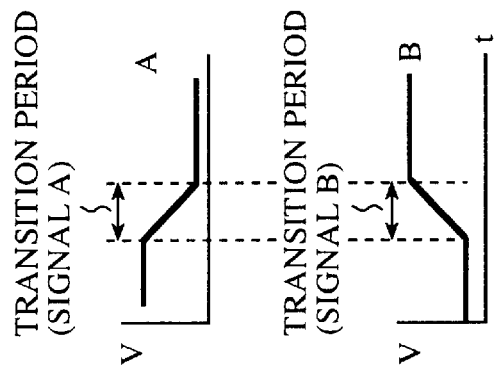
FIG. 5C shows the signals of which the level transition directions agree with each other.

In detail, in the route designing unit 2, level transition periods and level transition directions in signals A and B, which transmit through wires adjacent to each other, are calculated according to a dynamic or static timing analysis. In general, when level transition directions of signals transmitting through wires adjacent to each other differ from each other on condition that level transition periods of the signals overlap with each other, each signal is liable to be influenced by the other signal transmitting through the adjacent wire so as to delay a level change of the signal, and the signals are liable to be influenced by a cross-talk noise generated between the wires. Therefore, as shown in FIG. 5A, when the level transition directions of the signals A and B differ from each other on condition that the level transition periods of the signals A and B overlap with each other, as shown in FIG. 4B, a pair of inverter cells 13 embedded in an internal open space of the mega-cell 11 or the IO cell are inserted into both ends of one of the wires respectively. Therefore, as shown in FIG. 5c, the level transition directions of the signals A and B in the overlapping period of the level transition periods agree with each other.

Accordingly, the adverse influence of the cross-talk noise generated in the semiconductor integrated circuit can be reduced.

Embodiment 5

In the first embodiment, the buffer cell 12 and the inverter cell 13 embedded in the internal open space of the mega-cell 11 or the IO cell are inserted into wires in which signal error occurs because of the influence of the cross-talk noise. However, in a fifth embodiment, when level transition periods of signals transmitting through wires adjacent to each other overlap with each other, the buffer cell 12 is inserted into one wire corresponding to one signal, of which the level transition period is longer than that of the other signal transmitting through the other wire, to reduce a difference between the level transition periods of the signals.

Figure 6A:
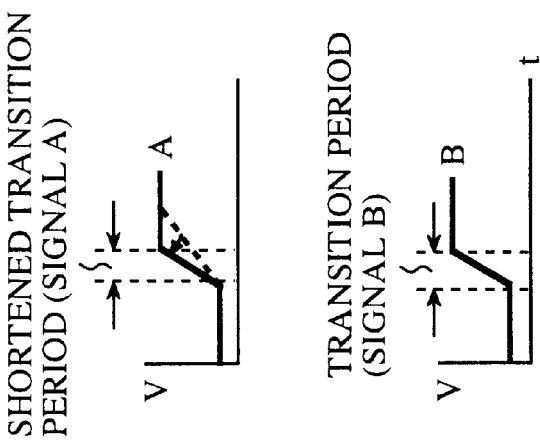
FIG. 6A shows signals, of which the lengths of level transition periods are different from each other while the level transition periods overlap with each other, according to a fifth embodiment of the present invention.
Figure 6B:
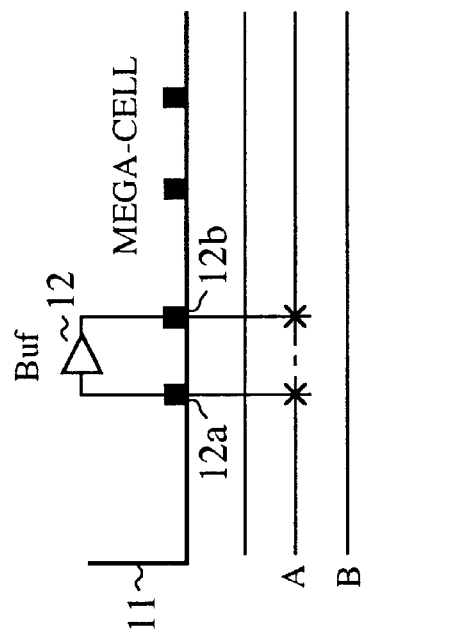
FIG. 6B is a plan view showing a buffer cell which is embedded in the internal of a mega-cell arranged in a part of a semiconductor integrated circuit and is inserted into a wire corresponding to one signal to reduce the difference between the level transition periods of the signals.
Figure 6C:
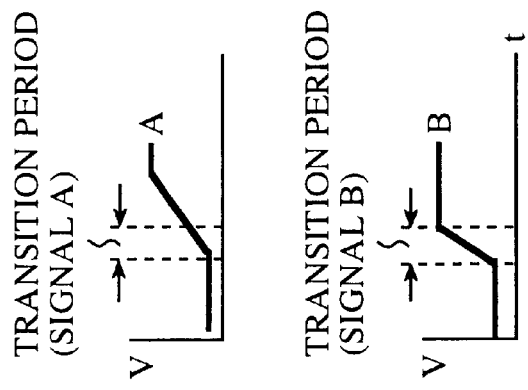
FIG. 6C shows the signals in which the difference between the level transition periods is reduced.

In detail, in the route designing unit 2, level transition periods of signals A and B, which transmit through wires adjacent to each other, are calculated according to a dynamic or static timing analysis. In general, when a difference between level transition periods of signals transmitting through wires adjacent to each other is large, the signal having the longer level transition period is liable to be influenced by a cross-talk noise generated between the wires as compared with the signal having the shorter level transition period. Therefore, as shown in FIG. 6A, when the level transition period of the signal A is longer than that of the signal B, as shown in FIG. 6B, the buffer cell 12 is inserted into one wire corresponding to the signal A of which the level transition period is longer than that of the other signal B transmitting through the other wire. Therefore, as shown in FIG. 6C, the level transition period of the signal A transmitting through the wire, into which the buffer cell 12 is inserted, is shortened, and the difference between the level transition periods of the signals A and B is reduced.

Accordingly, the adverse influence of the cross-talk noise generated in the semiconductor integrated circuit can be reduced.

Embodiment 6

In the first embodiment, the buffer cell 12 and the inverter cell 13 embedded in the internal open space of the mega-cell 11 or the IO cell are inserted into wires in which signal error occurs because of the influence of the cross-talk noise. However, in a sixth embodiment, a plurality of types of cross-talk noise improving cells (for example, a plurality of buffer cells 12 of which delay values or drivability values differ from each other) are embedded in an internal open space of the mega-cell 11 or the IO cell, and one of the cross-talk noise improving cells is selected and inserted into a wire.

Figure 7:
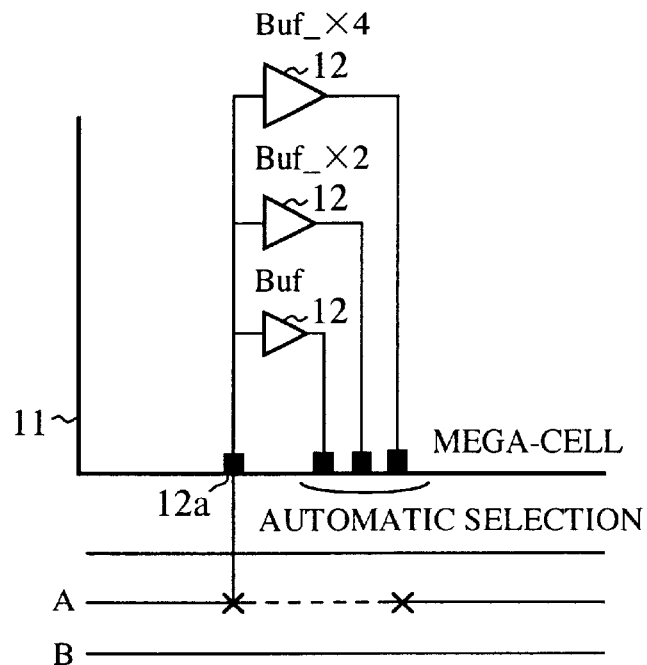
FIG. 7 is a plan view showing a plurality of buffer cells, which have a plurality of drivability values different from each other and are embedded in the internal of a mega-cell arranged in a part of a semiconductor integrated circuit, according to a sixth embodiment of the present invention.

In an example shown in FIG. 7, three types of buffer cells 12 having delay values or drivability values different from each other are embedded in advance in the mega-cell 11, and one of the buffer cells 12 is automatically selected according to the design performed in the cell placement designing unit 1 and is inserted into a wire.

Accordingly, the adverse influence of the cross-talk noise generated in the semiconductor integrated circuit can be reduced with high precision.

Embodiment 7

In the sixth embodiment, three types of buffer cells 12 having delay values or drivability values different from each other are embedded in the mega-cell 11, and one of the buffer cells 12 is automatically selected and is inserted into a wire. However, in a seventh embodiment, a plurality of cross-talk noise improving cells are embedded in an internal open space of the mega-cell 11 or the IO cell, and one or more cross-talk noise improving cells are selected and inserted into a wire.

Figure 8:
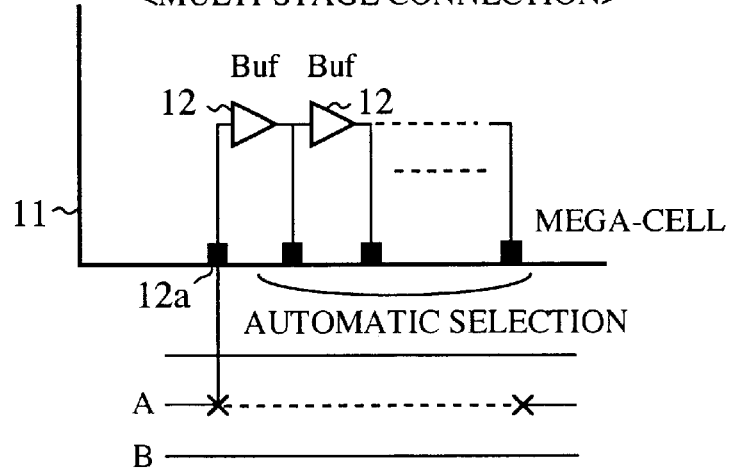
FIG. 8 is a plan view showing a plurality of buffer cells, which are serially embedded in the internal of a mega-cell arranged in a part of a semiconductor integrated circuit, according to a seventh embodiment of the present invention.

In an example shown in FIG. 8, a plurality of buffer cells 12 are serially embedded in advance in the mega-cell 11, the number of buffer cells, which are serially arranged and are to be inserted into a wire, is automatically determined according to the design performed in the cell placement designing unit 1, and one or more cross-talk noise improving cells, of which the number is automatically determined, are inserted serially into a wire.

Accordingly, the adverse influence of the cross-talk noise generated in the semiconductor integrated circuit can be reduced with high precision.

Embodiment 8

In the first to seventh embodiments, the buffer cell 12 and/or the inverter cell 13 embedded in the internal open space of the mega-cell 11 or the IO cell are inserted into one or more wires of the semiconductor integrated circuit. However, in an eighth embodiment, when an open space exists in a position which is placed in the outside of the hard macro-block in the semiconductor integrated circuit, a buffer cell or an inverter cell is embedded in advance in the open space of the semiconductor integrated circuit, and the buffer cell or the inverter cell is inserted into a wire of the semiconductor integrated circuit according to the design performed in the cell placement designing unit 1.

Accordingly, the cross-talk noise can be reduced without increasing an area of the semiconductor integrated circuit.

Embodiment 9

In the conventional automatic cell placement and routing apparatus, connection information of the semiconductor integrated circuit (for example, terminal information and instance information of the mega cell 11) is output in the form of a netlist. However, even though the connection information of the semiconductor integrated circuit is merely output in the form of a netlist, because connection information of cross-talk noise improving cells is not output, an operator cannot ascertain the connection of the buffer cells 12 and the inverter cells 13 with wires performed to reduce the adverse influence of the cross-talk noise.

Therefore, in a ninth embodiment, connection information of cross-talk noise improving cells is output in the form of a netlist according to the design of the route designing unit 2 of the automatic cell placement and routing apparatus.

As shown in FIG. 9A, when no cross-talk noise improving cell is inserted into a wire, a netlist shown in FIG. 9B is output. In this case, the netlist shown in FIG. 9B is the same as that output by the conventional automatic cell placement and routing apparatus. In contrast, as shown in FIG. 9C, when cross-talk noise improving cells such as the buffer cell 12 and the inverter cell 13 are inserted into wires respectively, a netlist shown in FIG. 9D is output. In this netlist, connection information of the cross-talk noise improving cells is written with the connection information of the semiconductor integrated circuit.

Accordingly an operator can ascertain the connection of the cross-talk noise improving cells with the wires of the semiconductor integrated circuit.

Embodiment 10

In the ninth embodiment, the cross-talk noise improving cells are treated as members of the mega-cell 11 or the IO cell in the netlist in which the connection information of the cross-talk noise improving cells is written with the connection information of the semiconductor integrated circuit. However, as shown in FIG. 10D, a netlist comprises connection information of the cross-talk noise improving cells which is written with the connection information of the semiconductor integrated circuit as if the cross-talk noise improving cells actually embedded in the mega-cell 11 or the IO cell are arranged independent of the mega-cell 11 or the IO cell. The netlist is output according to the design of the route designing unit 2 of the automatic cell placement and routing apparatus.

Accordingly an operator can easily ascertain the connection of the cross-talk noise improving cells with the wires of the semiconductor integrated circuit.

Embodiment 11

Figure 11A:
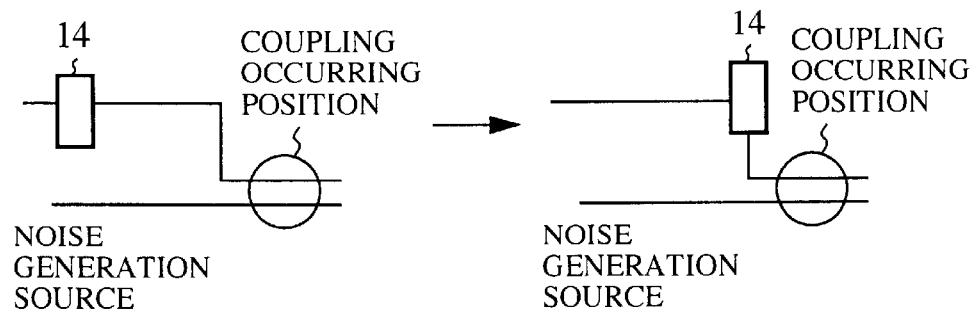
FIG. 11A is a plan view explanatorily showing the movement of a signal driving cell, which is placed far from a cross-coupling occurring position, to a position near to the cross-coupling occurring position in a part of a semiconductor integrated circuit according to an eleventh embodiment of the present invention.
Figure 11B:
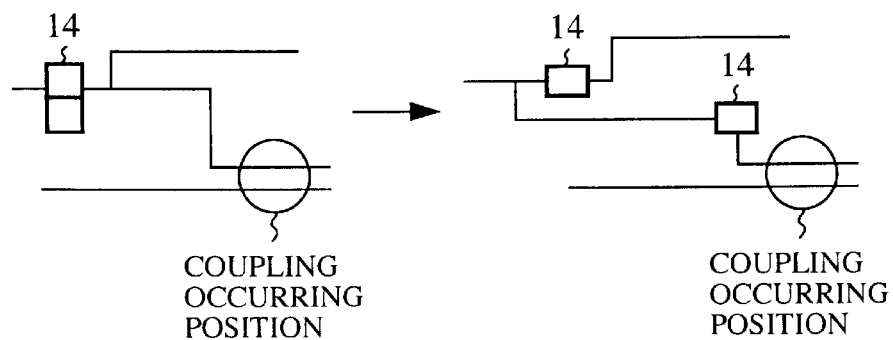
FIG. 11B is a plan view explanatorily showing the separated placement of one of a plurality of signal driving cells to a position near to a cross-coupling occurring position in a part of a semiconductor integrated circuit according to the eleventh embodiment of the present invention.

In the first embodiment, the buffer cell 12 and the inverter cell 13 fixedly embedded in the internal open space of the mega-cell 11 or the IO cell are inserted into wires to reduce the influence of the cross-talk noise. However, in an eleventh embodiment, as shown in FIG. 11A, a signal driving cell 14, which is inserted into a wire of the semiconductor integrated circuit, is moved to place the signal driving cell 14 in the neighborhood of a cross-coupling occurring position. Therefore, a length of a wire between the signal driving cell 14 and the cross-coupling occurring position is shortened. Also, as shown in FIG. 11B, one of a plurality of signal driving cells 14, which are inserted into a wire of the semiconductor integrated circuit, is moved to place the signal driving cell 14 which is positioned separately from the other signal driving cell 14, in the neighborhood of a cross-coupling occurring position. Therefore, a length of a wire between the signal driving cell 14 and the cross-coupling occurring position is shortened.

Accordingly, because the length of the wire can be shortened, the cross-talk noise can be reduced without increasing an area of the semiconductor integrated circuit.

Embodiment 12

In the first embodiment, the buffer cell 12 and the inverter cell 13 embedded in the internal open space of the mega-cell 11 or the IO cell are inserted into fixed wires to reduce the influence of the cross-talk noise. However, in a twelfth embodiment, when it is expected that an error occurs in signals, which transmit through wires adjacent to each other in a wiring plane, because of the influence of a cross-talk noise generated between the wires, one wire (that is, a changed wire 15 in the example shown in each of FIG. 12 to FIG. 22) is selected from the wires and is moved to another wiring plane, and an electric power supply wire VDD or a ground wire GND is arranged as a shielding wire in an open space in which the selected wire is originally placed.

Figure 12:
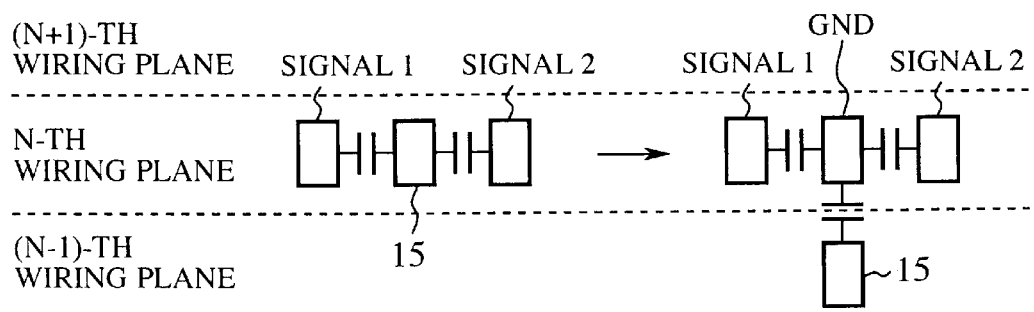
FIG. 12 is a cross sectional view schematically showing a first three-dimensional shield wiring in a part of a semiconductor integrated circuit according to a twelfth embodiment of the present invention.

In a first three-dimensional shield wiring shown in FIG. 12, when the wire 15 is placed between wires corresponding to first and second signals in the N-th wiring plane, the wire 15 is moved to the (N−1)-th wiring plane, and a ground wire GND is arranged in an opening area in which the wire 15 is originally-placed.

Figure 13:
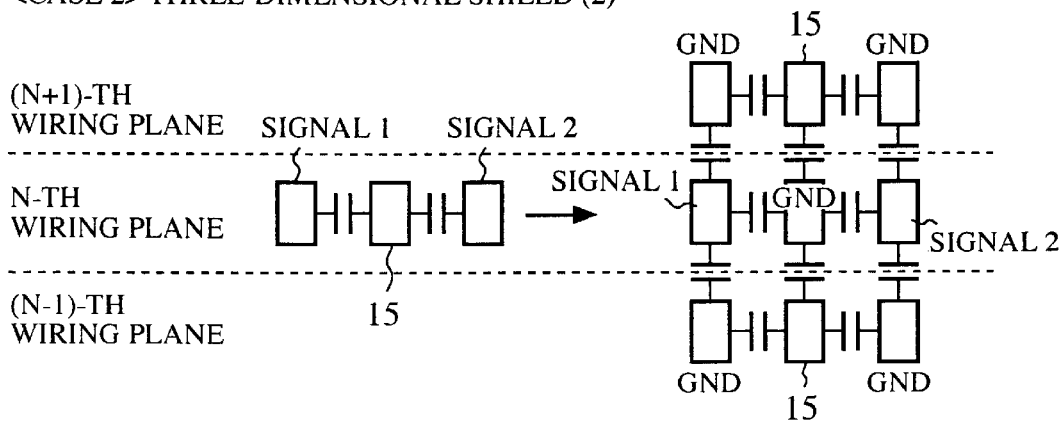
FIG. 13 is a cross sectional view schematically showing a second three-dimensional shield wiring in a part of a semiconductor integrated circuit according to the twelfth embodiment of the present invention.

In a second three-dimensional shield wiring shown in FIG. 13, when the wire 15 is placed between wires corresponding to first and second signals in the N-th wiring plane, the wire 15 is divided into two wires 15, the divided wires 15 are moved to the (N−1)-th wiring plane and the (N+1)-th wiring plane, a ground wire GND is arranged in an opening area in which the wire 15 is originally placed, and two ground wires GND are arranged on both sides of each divided wire 15 respectively.

Figure 14:
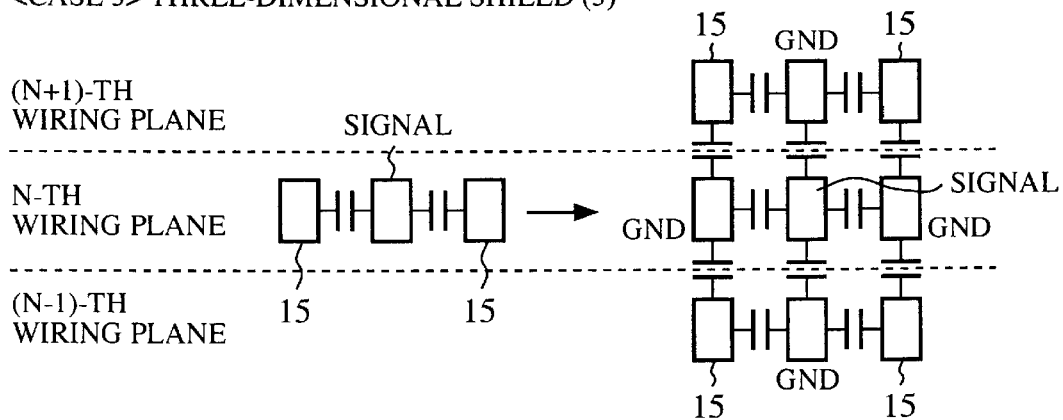
FIG. 14 is a cross sectional view schematically showing a third three-dimensional shield wiring in a part of a semiconductor integrated circuit according to the twelfth embodiment of the present invention.

In a third three-dimensional shield wiring shown in FIG. 14, when two wires 15 are placed on both sides of a wire corresponding to a signal in the N-th wiring plane, each wire 15 is divided into two wires 15, one group of divided wires 15 is moved to the (N−1)-th wiring plane, the other group of divided wires 15 is moved to the (N+1)-th wiring plane, a ground wire GND is arranged in each opening area in which one wire 15 is originally placed, and a ground wire GND is arranged between the divided wires 15 for each group.

Figure 15:
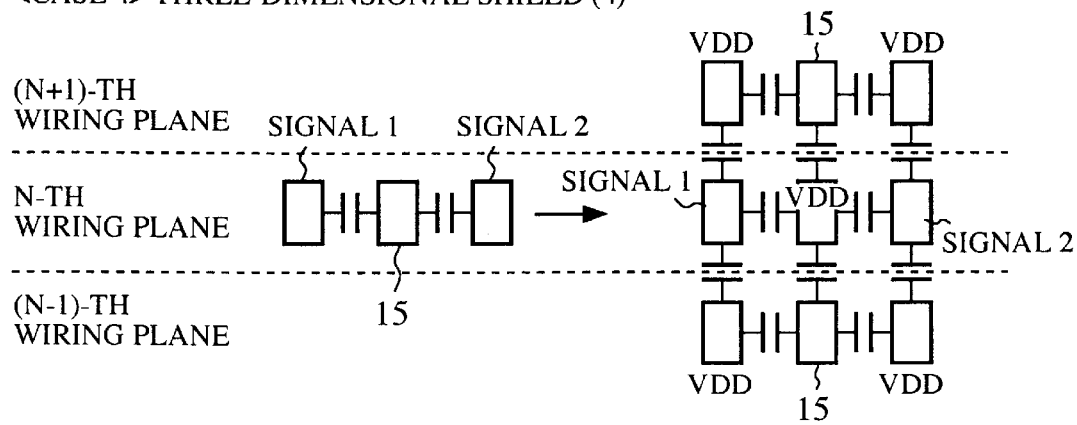
FIG. 15 is a cross sectional view schematically showing a fourth three-dimensional shield wiring in a part of a semiconductor integrated circuit according to the twelfth embodiment of the present invention.

In a fourth three-dimensional shield wiring shown in FIG. 15, when the wire 15 is placed between wires corresponding to first and second signals in the N-th wiring plane, the wire 15 is divided into two wires 15, the divided wires 15 are moved to the (N−1)-th wiring plane and the (N+1)-th wiring plane, an electric power supply wire VDD is arranged in an opening area in which the wire 15 is originally placed, and two electric power supply wires VDD are arranged on both sides of each divided wire 15 respectively.

Figure 16:
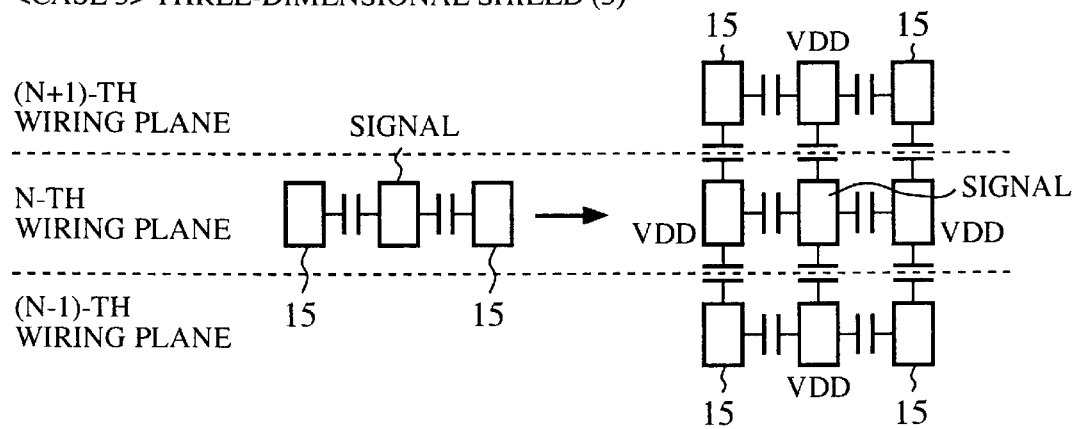
FIG. 16 is a cross sectional view schematically showing a fifth three-dimensional shield wiring in a part of a semiconductor integrated circuit according to the twelfth embodiment of the present invention.

In a fifth three-dimensional shield wiring shown in FIG. 16, when two wires 15 are placed on both sides of a wire corresponding to a signal in the N-th wiring plane, each wire 15 is divided into two wires 15, one group of divided wires 15 is moved to the (N−1)-th wiring plane, the other group of divided wires 15 is moved to the (N+1)-th wiring plane, an electric power supply wire VDD is arranged in each opening area in which one wire 15 is originally placed, and an electric power supply wire VDD is arranged between the divided wires 15 for each group.

Figure 17:
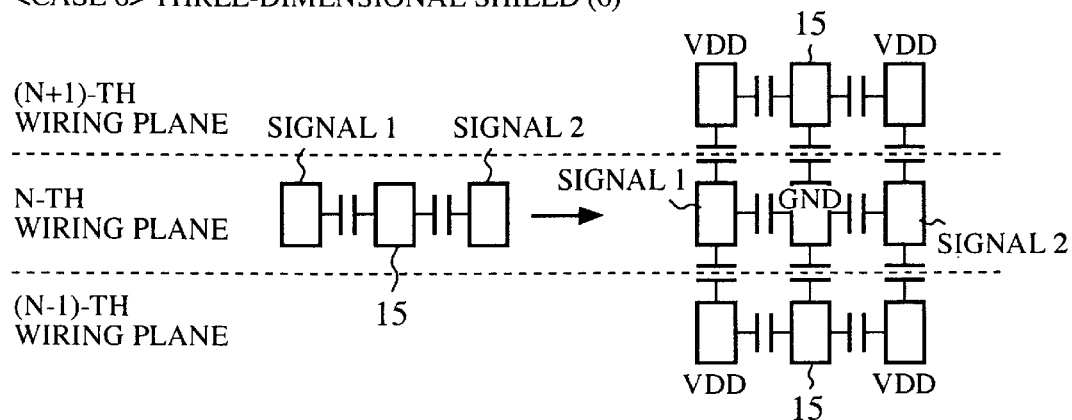
FIG. 17 is a cross sectional view schematically showing a sixth three-dimensional shield wiring in a part of a semiconductor integrated circuit according to the twelfth embodiment of the present invention.

In a sixth three-dimensional shield wiring shown in FIG. 17, when the wire 15 is placed between wires corresponding to first and second signals in the N-th wiring plane, the wire 15 is divided into two wires 15, the divided wires 15 are moved to the (N−1)-th wiring plane and the (N+1)-th wiring plane, a ground wire GND is arranged in an opening area in which the wire 15 is originally placed, and two electric power supply wires VDD are arranged on both sides of each divided wire 15 respectively.

Figure 18:
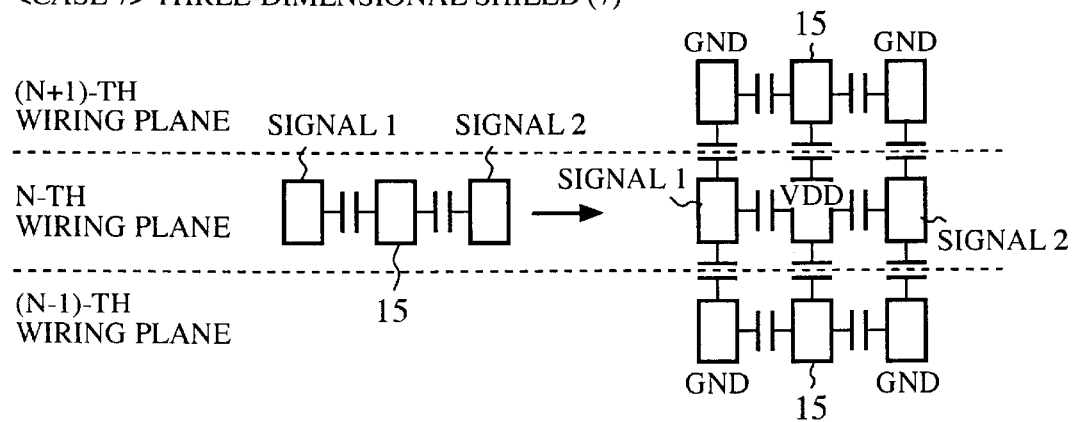
FIG. 18 is a cross sectional view schematically showing a seventh three-dimensional shield wiring in a part of a semiconductor integrated circuit according to the twelfth embodiment of the present invention.

In a seventh three-dimensional shield wiring shown in FIG. 18, when the wire 15 is placed between wires corresponding to first and second signals in the N-th wiring plane, the wire 15 is divided into two wires 15, the divided wires 15 are moved to the (N−1)-th wiring plane and the (N+1)-th wiring plane, an electric power supply wire VDD is arranged in an opening area in which the wire 15 is originally placed, and two ground wires GND are arranged on both sides of each divided wire 15 respectively.

Figure 19:
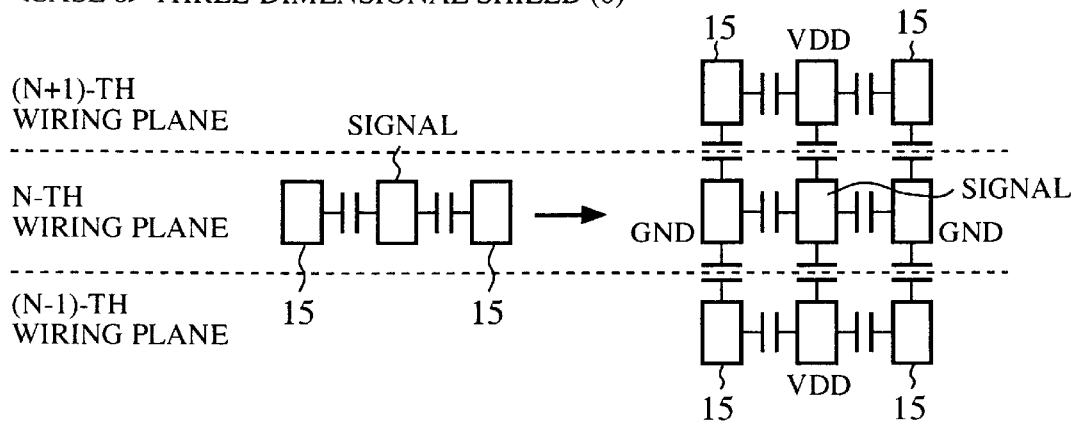
FIG. 19 is a cross sectional view schematically showing an eighth three-dimensional shield wiring in a part of a semiconductor integrated circuit according to the twelfth embodiment of the present invention.

In an eight three-dimensional shield wiring shown in FIG. 19, when two wires 15 are placed on both sides of a wire corresponding to a signal in the N-th wiring plane, each wire 15 is divided into two wires 15, one group of divided wires 15 is moved to the (N−1)-th wiring plane, the other group of divided wires 15 is moved to the (N+1)-th wiring plane, a ground wire GND is arranged in each opening area in which one wire 15 is originally placed, and an electric power supply wire VDD is arranged between the divided wires 15 for each group.

Figure 20:
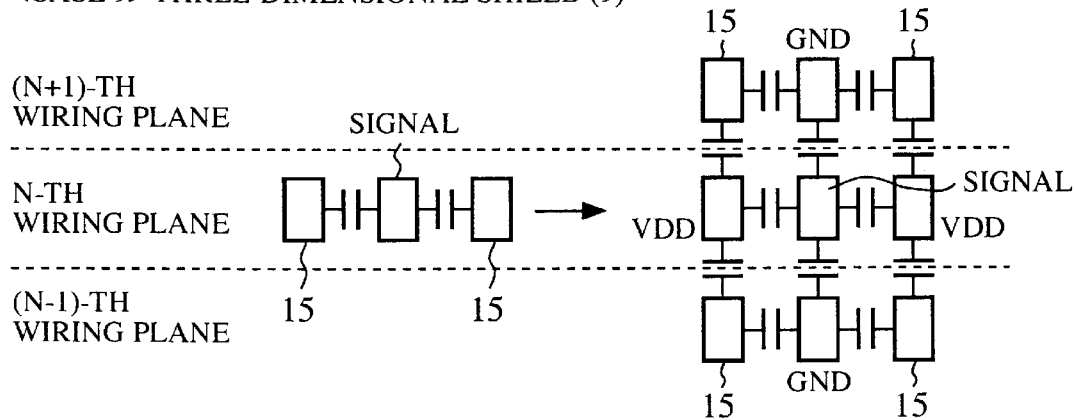
FIG. 20 is a cross sectional view schematically showing a ninth three-dimensional shield wiring in a part of a semiconductor integrated circuit according to the twelfth embodiment of the present invention.

In a ninth three-dimensional shield wiring shown in FIG. 20, when two wires 15 are placed on both sides of a wire corresponding to a signal in the N-th wiring plane, each wire 15 is divided into two wires 15, one group of divided wires 15 is moved to the (N−1)-th wiring plane, the other group of divided wires 15 is moved to the (N+1)-th wiring plane, an electric power supply wire VDD is arranged in each opening area in which one wire 15 is originally placed, and a ground wire GND is arranged between the divided wires 15 for each group.

Figure 21:
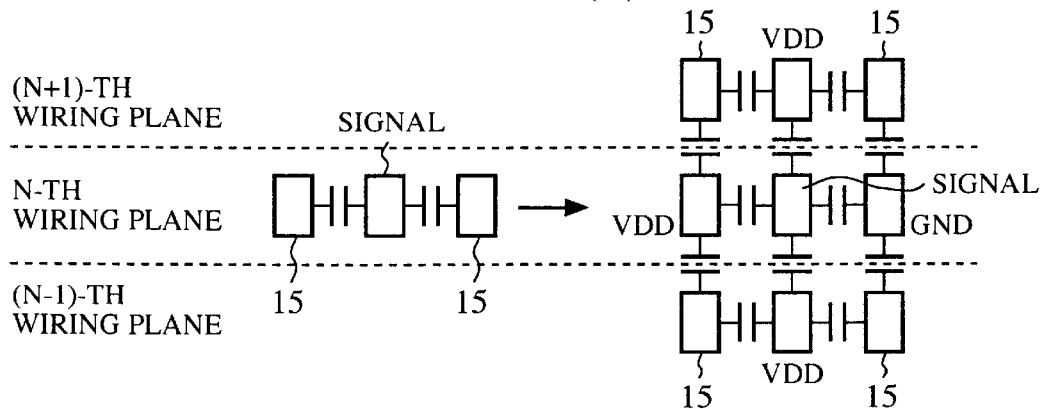
FIG. 21 is a cross sectional view schematically showing a tenth three-dimensional shield wiring in a part of a semiconductor integrated circuit according to the twelfth embodiment of the present invention.

In a tenth three-dimensional shield wiring shown in FIG. 21, when two wires 15 are placed on both sides of a wire corresponding to a signal in the N-th wiring plane, each wire 15 is divided into two wires 15, one group of divided wires 15 is moved to the (N−1)-th wiring plane, the other group of divided wires 15 is moved to the (N+1)-th wiring plane, a ground wire GND is arranged in one opening area in which one wire 15 is originally placed, an electric power supply wire VDD is arranged in the other opening area in which the other wire 15 is originally placed, and an electric power supply wire VDD is arranged between the divided wires 15 for each group.

Figure 22:
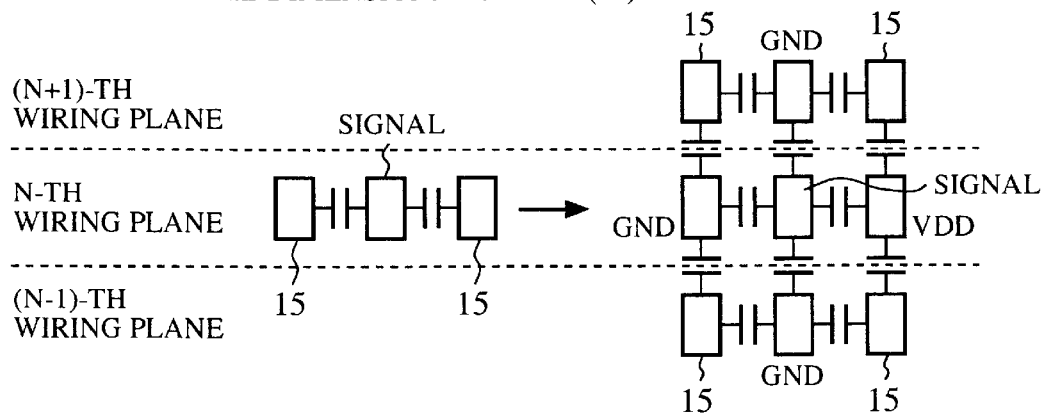
FIG. 22 is a cross sectional view schematically showing an eleventh three-dimensional shield wiring in a part of a semiconductor integrated circuit according to the twelfth embodiment of the present invention.

In an eleventh three-dimensional shield wiring shown in FIG. 22, when two wires 15 are placed on both sides of a wire corresponding to a signal in the N-th wiring plane, each wire 15 is divided into two wires 15, one group of divided wires 15 is moved to the (N−1)-th wiring plane, the other group of divided wires 15 is moved to the (N+1)-th wiring plane, a ground wire GND is arranged in one opening area in which one wire 15 is originally placed, an electric power supply wire VDD is arranged in the other opening area in which the other wire 15 is originally placed, and a ground wire GND is arranged between the divided wires 15 for each group.

Therefore, a three-dimensional shield wiring can be performed without preparing a track for the shield wiring. Accordingly, the cross-talk noise can be reduced without increasing an area of the semiconductor integrated circuit.

What is claimed is:

1. An automatic cell placement and routing apparatus, in which the placement of hard macro-blocks composing a semiconductor integrated circuit is designed and the routing in the semiconductor integrated circuit is designed, comprising:
   a first designing unit for designing the placement of the hard macro-blocks and standard cells according to various design conditions; and
   a second designing unit for designing a route of each signal wire of the semiconductor integrated circuit according to various conditions;
   wherein a cross-talk noise improving cell, which has an external interface, is embedded in advance by the first designing unit in an internal open space of one hard macro-block, and the cross-talk noise improving cell is inserted by the second designing unit into a wire of the semiconductor integrated circuit where an error occurs due to cross-talk noise.

2. An automatic cell placement and routing apparatus according to claim 1, wherein the cross-talk noise improving cell is inserted into one of wires adjacent to each other, by the second designing unit when level transition periods of signals of the wires overlap with each other.

3. An automatic cell placement and routing apparatus according to claim 1, wherein the cross-talk noise improving cell, composed of an inverter cell, is inserted into one of wires adjacent to each other, by the second designing unit when level transition periods of signals of the wires overlap with each other and level transition directions of the signals differ from each other.

4. An automatic cell placement and routing apparatus according to claim 1, wherein the cross-talk noise improving cell is inserted into a first wire whose level transition period is longer than that of a second wire, by the second designing unit when a level transition period of a signal of the first wire overlaps with a level transition period of a signal of a second wire adjacent to the first wire.

5. An automatic cell placement and routing apparatus according to claim 1, wherein a plurality of types of cross-talk noise improving cells are embedded in the internal open space of the hard macro-block by the first designing unit, and one type of cross-talk noise improving cell selected from the types of cross-talk noise improving cells is inserted into the wire of the semiconductor integrated circuit by the second designing unit.

6. An automatic cell placement and routing apparatus according to claim 1, wherein a plurality cross-talk noise improving cells are embedded in the internal open space of the hard macro-block by the first designing unit, and one or more cross-talk noise improving cells selected from the cross-talk noise improving cells are inserted into the wire of the semiconductor integrated circuit by the second designing unit.

7. An automatic cell placement and routing apparatus according to claim 1, wherein the cross-talk noise improving cell is embedded in an open space, which is placed outside of the hard macro-block, by the first designing unit to insert the cross-talk noise improving cell into the wire of the semiconductor integrated circuit.

8. An automatic cell placement and routing apparatus according to claim 1, wherein connection information of the cross-talk noise improving cell is output in the form of a netlist by the second designing unit.

9. An automatic cell placement and routing apparatus according to claim 8, wherein connection information of the cross-talk noise improving cell is output by the second designing unit in the form of a netlist in which the cross-talk noise improving cell embedded in the internal open space of the hard macro-block is to be arranged independent of the hard macro-block.

10. An automatic cell placement and routing method using the automatic cell placement and routing apparatus of claim 1, wherein the method includes a step of inserting the cross-talk noise improving cell into the wire.

11. An automatic cell placement and routing apparatus, in which placement of hard macro-blocks composing a semiconductor integrated circuit is designed and routing in the semiconductor integrated circuit is designed, comprising:
    a designing unit for moving a placed and inserted signal driving cell to a position near a cross-coupling occurring position and for inserting the moved signal driving cell into a wire of the semiconductor integrated circuit.

12. An automatic cell placement and routing method using the automatic cell placement and routing apparatus of the claim 11, wherein the method includes a step of moving the placed signal driving cell, which is to be inserted into the wire, at the position near to the cross-coupling occurring position.

13. An automatic cell placement and routing apparatus according to claim 11, in which placement of hard macro-blocks comprising a semiconductor integrated circuit is designed and routing in the semiconductor integrated circuit is designed, comprising:
    a designing unit for moving one of a plurality of signal driving cells to a position near a cross-coupling occurring position, and for inserting the moved signal driving cell which is positioned separately from other signal cells into a wire of the semiconductor integrated circuit.

* * * * *